US010831597B2

(12) United States Patent
Gupta et al.

(10) Patent No.: US 10,831,597 B2
(45) Date of Patent: *Nov. 10, 2020

(54) RECEIVING, AT A SECONDARY STORAGE CONTROLLER, INFORMATION ON MODIFIED DATA FROM A PRIMARY STORAGE CONTROLLER TO USE TO CALCULATE PARITY DATA

(71) Applicant: INTERNATIONAL BUSINESS MACHINES CORPORATION, Armonk, NY (US)

(72) Inventors: Lokesh M. Gupta, Tucson, AZ (US); Matthew G. Borlick, Tucson, AZ (US); Kevin J. Ash, Tucson, AZ (US); John C. Elliott, Tucson, AZ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/965,319

(22) Filed: Apr. 27, 2018

(65) Prior Publication Data

US 2019/0332471 A1 Oct. 31, 2019

(51) Int. Cl.
*G06F 11/08* (2006.01)
*G06F 11/10* (2006.01)
*G11C 29/52* (2006.01)

(52) U.S. Cl.
CPC .......... *G06F 11/1068* (2013.01); *G11C 29/52* (2013.01)

(58) Field of Classification Search
None
See application file for complete search history.

(56) References Cited

U.S. PATENT DOCUMENTS 4,354,232 A 10/1982 Ryan
5,922,057 A 7/1999 Holt
(Continued)

FOREIGN PATENT DOCUMENTS

CN 101566977 A 10/2009
CN 104508645 A 4/2015
(Continued)

OTHER PUBLICATIONS

Agarwal, N., et al., "Design Tradeoffs for SSD Performance", [online], translated on Apr. 25, 2008, [Retrieved on Jan. 21, 2018], Retrieved from the Internet at URL: <https://www.usenix.org/legacy/event/usenix08/tech/full_papers/agrawa . . . , 22 pp.
(Continued)

*Primary Examiner* — Mujtaba M Chaudry
(74) *Attorney, Agent, or Firm* — David W. Victor; Konrad Raynes Davda & Victor LLP

(57) ABSTRACT

Provided are a computer program product, system, and method for receiving, at a secondary storage controller, information on modified data from a primary storage controller to use to calculate parity data. The secondary storage controller receives from the primary storage controller difference data calculated from modified data and a pre-modified version of the modified data for a primary group of tracks at the primary storage and one of the modified data and new primary parity data calculated at the primary storage controller from the modified data and the difference data. The secondary storage controller uses the difference data and one of the modified data and the new primary parity data to write new secondary parity data and the modified data to a secondary group of tracks at the secondary storage.

23 Claims, 11 Drawing Sheets

(56) References Cited

U.S. PATENT DOCUMENTS

| | | | |
|---|---|---|---|
| 6,385,683 | B1 | 5/2002 | DeKoning et al. |
| 6,463,503 | B1 | 10/2002 | Jones et al. |
| 6,934,318 | B2 | 8/2005 | Sarkar |
| 8,392,800 | B2 | 3/2013 | Etkin |
| 8,719,645 | B2 | 5/2014 | Chiu et al. |
| 8,762,609 | B1 | 6/2014 | Lam et al. |
| 9,116,858 | B1 | 8/2015 | Yokoi et al. |
| 9,304,689 | B2 | 4/2016 | Guo et al. |
| 9,384,093 | B1 | 7/2016 | Aiello |
| 9,542,344 | B2 | 1/2017 | Tuers et al. |
| 9,563,382 | B2 | 2/2017 | Hahn et al. |
| 9,720,601 | B2 | 8/2017 | Gupta et al. |
| 2001/0002480 | A1 | 5/2001 | Dekoning et al. |
| 2001/0028520 | A1 | 10/2001 | Amada et al. |
| 2003/0016596 | A1 | 1/2003 | Chiquoine et al. |
| 2005/0022097 | A1 | 1/2005 | Cheng |
| 2005/0278607 | A1 | 12/2005 | Garodnick |
| 2006/0036901 | A1 | 2/2006 | Yang et al. |
| 2009/0172244 | A1 | 7/2009 | Wang et al. |
| 2012/0230104 | A1 | 9/2012 | Kim et al. |
| 2013/0013857 | A1 | 1/2013 | Dawkins et al. |
| 2015/0286419 | A1 | 10/2015 | Guo et al. |
| 2016/0054942 | A1 | 2/2016 | Yu et al. |
| 2016/0110283 | A1 | 4/2016 | Iyigun et al. |
| 2016/0328301 | A1 | 11/2016 | Parakh et al. |
| 2017/0031596 | A1 | 2/2017 | Galbraith et al. |
| 2017/0097886 | A1 | 4/2017 | Banerjee et al. |
| 2017/0103016 | A1 | 4/2017 | Stalzer |
| 2017/0139594 | A1 | 5/2017 | Ahn et al. |
| 2017/0139823 | A1 | 5/2017 | Tomlin et al. |
| 2017/0139825 | A1 | 5/2017 | Dubeyko et al. |
| 2017/0249222 | A1* | 8/2017 | Patnaik .................. G06F 3/0619 |
| 2017/0322845 | A1 | 11/2017 | Nomura et al. |
| 2017/0329541 | A1* | 11/2017 | Hayasaka ............... G06F 3/064 |
| 2018/0011527 | A1 | 1/2018 | Kim |
| 2018/0364949 | A1* | 12/2018 | Aston ................... G06F 3/0661 |
| 2019/0317898 | A1 | 10/2019 | Gupta et al. |
| 2019/0332470 | A1 | 10/2019 | Gupta et al. |

FOREIGN PATENT DOCUMENTS

| | | |
|---|---|---|
| CN | 106790599 A | 5/2017 |
| EP | 1452967 | 9/2004 |
| EP | 1188119 | 12/2009 |
| WO | WO2017081593 | 5/2017 |
| WO | WO2018004836 | 1/2018 |

OTHER PUBLICATIONS

Cobb, D., "NVM Express and the PCI Express SSD Revolution", Intel Developer Forum 2012, © 2012 Intel Corporation, 48 pp.©©☐

Evans, C., "Does NVMe Signal the End of the Storage Controller?", [online], Aug. 15, 2017, [Retrieved on Mar. 19, 2018], Retrieved from the Internet at URL: <http://www.computerweekly.com/feature/Does-NVMe-signal-the-end-of-t . . . >, 2 pp.

Marks, K., "An NVM Express Tutorial", Flash Memory Summit 2013, 92 pp.

Disclosed Anonymously, "Method for Enhanced Application Performance and Improved Loadbalancing Considerations in Multi-tier Storage Environment", IP.Com Number: IPCOM000250728D, Aug. 29, 2017, 7 pp.

Metz, J., "Under the Hood with NVMe Over Fabrics", Interop Expo Las Vegas, May 2016, 44 pp.

NVM Express, "NNVM Express", Revision 1.3a, Oct. 24, 2017, 287 pp. (Submitted in 2 uploads PartA and PartB to size limit).

NVM Express, "NVM Product Overview", [online], © 2018 NVM Express, Inc., [Retrieved on Mar. 19, 2018], Retrieved from the Internet at URL: <https://nvmexpress.org/about/nvm-express-overview/>, 2 pp.

Son, Y., et al., "An Empirical Evaluation of NVM Express SSD", 2015 International Conference on Cloud and Autonomic Computing, 8 pp.

Zhang, G., et al , "Adaptive Data Migration in Multi-tiered Storage Based Cloud Environment", 2010 IEEE 3rd International Conference on Cloud Computing, 8 pp.

U.S. Appl. No. 15/951,168, filed Apr. 11, 2018.

U.S. Appl. No. 15/965,268, filed Apr. 27, 2018.

List of IBM Patents or Patent Applications Treated as Related, dated Apr. 27, 2018, pp. 2.

PCT International Search Report and Written Opinion dated Aug. 20, 2019, pp. 9, for application No. PCT/IB2019/052653.

English translation of CN101566977A.

English translation of CN104508645A.

English translation of CN106790599A.

Office Action dated Sep. 11, 2019, pp. 20, for U.S. Appl. No. 15/965,268, filed Apr. 27, 2018.

Response dated Dec. 11, 2019, pp. 9, to Office Action dated Sep. 11, 2019, pp. 20, for U.S. Appl. No. 15/965,268.

Notice of Allowance dated Jan. 10, 2020, pp. 13, for U.S. Appl. No. 15/965,268.

Office Action dated Mar. 31, 2020, pp. 43, for U.S. Appl. No. 15/951,168.

Response dated Jun. 27, 2020, pp. 15, to Office Action dated Mar. 31, 2020, pp. 43, for U.S. Appl. 15/951,168.

Final Office Action dated Jul. 14, 2020, pp. 21, for U.S. Appl. No. 15/951,168.

Notice of Allowance dated Apr. 27, 2020, pp. 11, for U.S. Appl. No. 15/965,268.

\* cited by examiner

RECEIVING, AT A SECONDARY STORAGE CONTROLLER, INFORMATION ON MODIFIED DATA FROM A PRIMARY STORAGE CONTROLLER TO USE TO CALCULATE PARITY DATA

BACKGROUND OF THE INVENTION

1. Field of the Invention

The present invention relates to a computer program product, system, and method for receiving, at a secondary storage controller, information on modified data from a primary storage controller to use to calculate parity data.

2. Description of the Related Art

A storage controller maintains one or more device adaptors to interface with an array of storages devices, such as storage devices a Redundant Array of Independent Disks (RAID) array. The device adaptors manage requests to the connected storage devices and implement the RAID controller and functions for the storage controller. In Nonvolatile Memory Express (NVMe), NVMe controllers may access read and write requests to the storage devices in submission queues in a host system and include RAID functionality to stripe data across storage devices, such as Solid State Drives (SSDs).

There is a need in the art for improved technologies for writing and reading data across an array of storage devices, such as a RAID array, in environments where multiple processor cores are reading and writing to tracks in stride groups in the cache that are stored in the storage devices, and where stride groups are mirrored from a primary storage controller to a secondary storage controller.

SUMMARY

Provided are a computer program product, system, and method for receiving, at a secondary storage controller, information on modified data from a primary storage controller to use to calculate parity data. The secondary storage controller receives from the primary storage controller difference data calculated from modified data and a pre-modified version of the modified data for a primary group of tracks at the primary storage and one of the modified data and new primary parity data calculated at the primary storage controller from the modified data and the difference data. The secondary storage controller uses the difference data and one of the modified data and the new primary parity data to write new secondary parity data and the modified data to a secondary group of tracks at the secondary storage.

DETAILED DESCRIPTION

Described embodiments provide improvements to computer technology for mirroring updates to a storage group, such as a stride group, from a primary storage controller to a secondary storage controller. Described embodiments improve the mirroring computer technology by having the primary storage controller calculate new primary parity data from modified data for a primary group of tracks in a primary storage and difference data from the modified data and a pre-modified version of the modified data. The primary storage controller sends the secondary storage controller the difference data and one of the modified data and the new primary parity data depending on whether the primary and secondary storage controllers have the same configuration for their parity data, so that the parity data calculated by the primary storage controller can be used at the secondary storage controller. Transmitting the difference data allows the secondary storage controller to calculate new secondary parity data for the secondary storage without having to read a previous version of the modified data. In this way, the primary storage controller transmits information to the secondary storage controller to optimize secondary storage controller operations to update a stride group and the parity data for the stride group at the secondary storage. Further, if the configurations of the stride groups are the same at the primary and secondary storage controllers, then the primary storage controller sends the new primary parity data to the secondary storage controller to use as the new secondary parity data for the stride group so that the secondary storage controller does not have to separately read the old parity data and calculate new parity data for the stride group to store at the secondary storage.

Figure 1A:
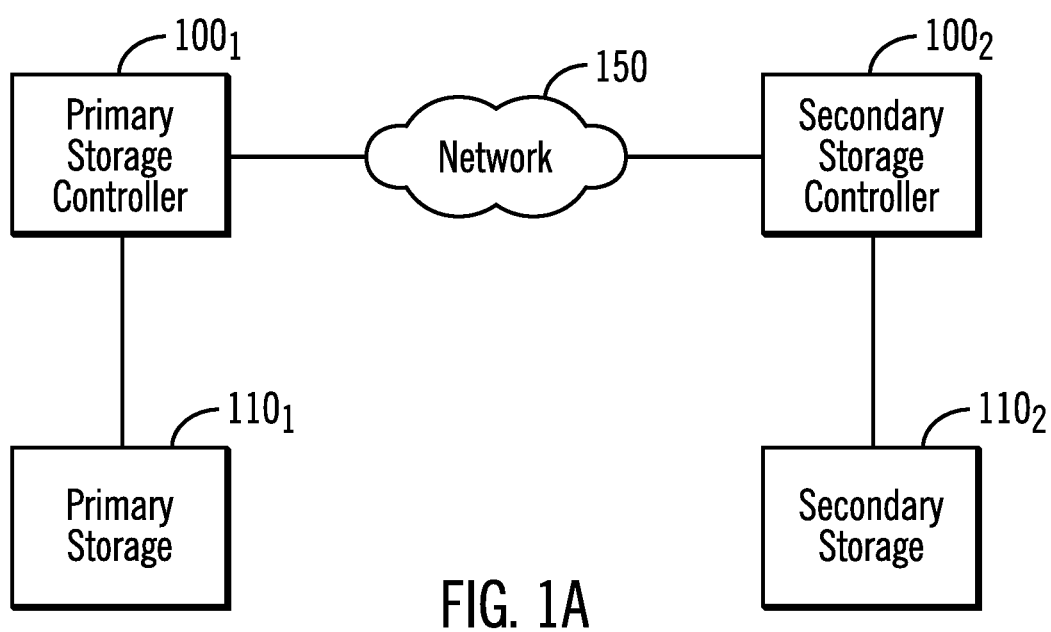
FIG. 1A illustrates an embodiment of a network computing environment having a primary storage controller and a secondary storage controller in which embodiments are implemented.
Figure 1B:
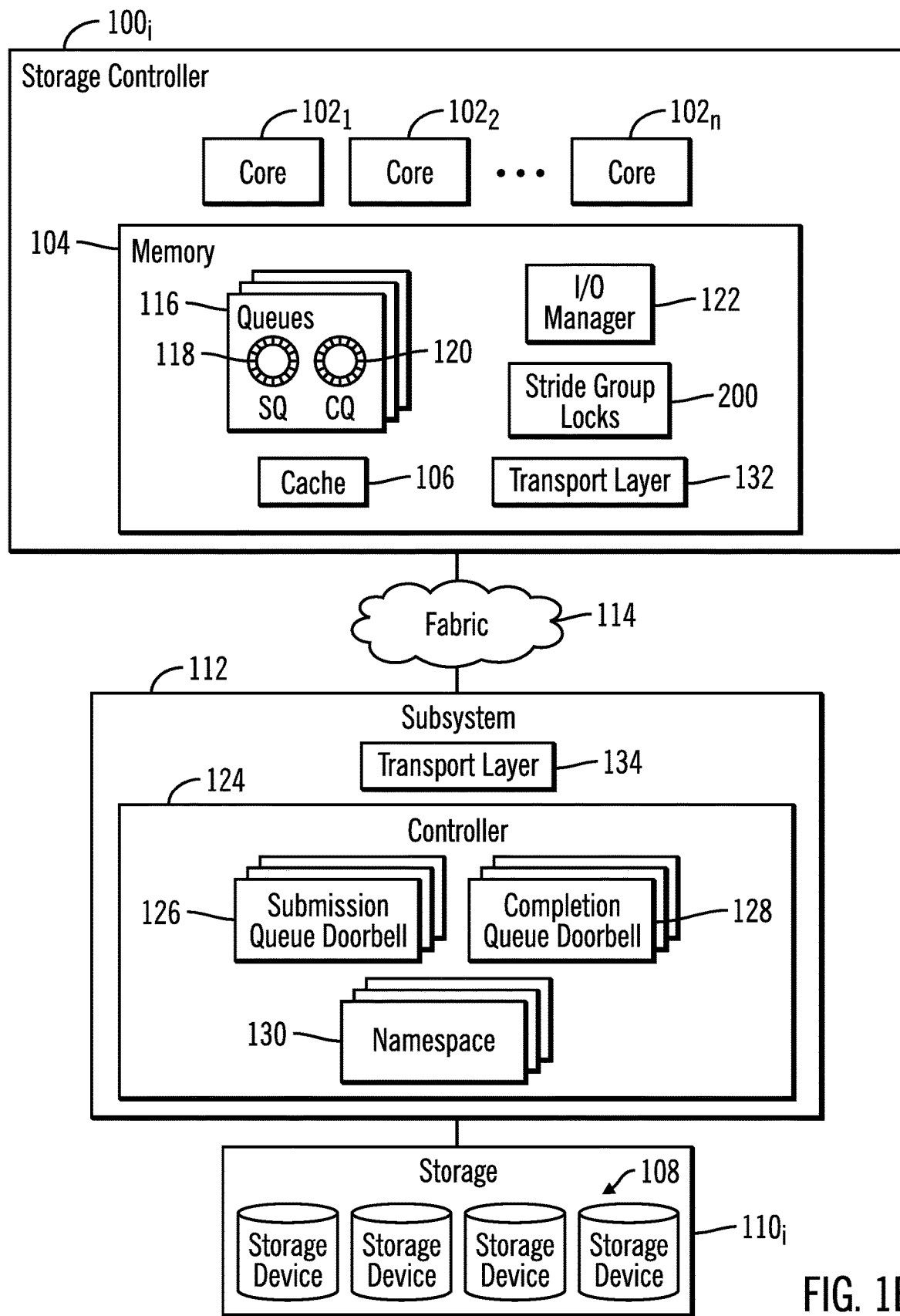
FIG. 1B illustrates an embodiment of a storage controller environment, such as the primary storage controller and the secondary storage controller.

FIG. 1A illustrates an embodiment of a network computing environment where a primary storage controller $100_1$ mirrors data for tracks in a primary storage $108_1$ to a secondary storage controller $100_2$ over a network 150 to store in the secondary storage $108_2$. The network 150 may comprise the Internet, a local area network, a wide area network and/or a wireless network. In embodiments where the primary storage $110_1$ and the secondary storage $110_2$ are configured as RAID arrays, the primary storage controller $100_1$ may destage data to the primary storage $110_1$ in stride groups and transfer modified data to the secondary storage controller $100_2$ to update a stride group at the secondary storage $110_2$ FIG. 1B illustrates an embodiment of an implementation of the primary $100_1$ and secondary storage controller $100_2$ as storage controller $100_i$ and an implementation of the primary $110_1$ and secondary $110_2$ storage as storage array $110_i$. Each storage controller (primary and secondary) $100_i$, such as storage controllers $100_1$ and $100_2$, may interface with a separate primary and secondary subsystem 112, respectively, to access the corresponding storage $110_i$, such as primary storage $110_1$ and secondary storage $110_2$. In further implementations, one subsystem 112 may interface multiple storage controllers $100_1$, $100_2$ to their underlying storages $110_1$, $110_2$, respectively.

With respect to FIG. 1B, storage controller $100_i$, or other type of system, includes a plurality of cores $102_1$, $102_2$ ... $102_n$ and a memory 104 including a cache 106 to cache tracks staged from storage devices 108 in a storage array 110 to make available to read requests. The storage controller $100_i$ is in communication with a subsystem 112 over a fabric 114, where read and write requests to the storage devices 108 are managed by the subsystem 112. The memory 104 includes queues 116, one for each of the cores $102_1$, $102_2$ ... $102_n$, where the queues 116 for each core $102_i$ include one or more submission queues (SQs) 118 to which read and write requests are added and a completion queue 120 (CQ). The queues 118, 120 may comprise circular queues each having a head pointer pointing to an end of the queue from which requests are accessed when the queue is processed and a tail pointer pointing to an end of the queue to which requests are added. A core $102_i$ executes an I/O manager 122 to add requests to the submission queues 118 for the core $102_i$ to stage tracks from the storage devices 108 to the cache 106 and destage tracks from the cache 106 to the storage devices 108.

A controller 124 in the subsystem 112 retrieves read and write requests to the storage devices 108 added to the submission queues 118 by the I/O manager 122 when the I/O manager 122 writes to a submission queue doorbell 126 in the controller 124. In response to completing the retrieved read or write request with respect to the storage devices 108, the controller 124 returns complete for the read or write request to the completion queue 120, which informs the core $102_1$, $102_2$ ... $102_n$ initiating the read or write request of the completion. The core $102_i$, executing the I/O manager 122, may write to a completion queue doorbell 128 to indicate completing processing the completion written to the completion queue 120 to coordinate the completion.

In Non-Volatile Memory Express (NVMe) embodiments, the controller 124 may comprise an NVMe controller and the I/O manager 122 may include NVMe drivers to interface with the NVMe controller 124, and implement the queues 116. The NVMe controller 124 may include submission queue doorbells 126, one for each of the submission queues used by a core $102_i$, and a completion queue doorbell 128. The core $102_i$ adding the request to its submission queue 118 writes to the controller 124 submission queue doorbell 126 to cause the controller 124 to access the read or write request added to the submission queue 118 associated with the written submission queue doorbell 126. The controller 124 may execute the fetched commands in any order. When the core $102_1$, $102_2$ ... $102_n$ processes a completion of a read/write request indicated in the completion queue 120, the core $102_1$, $102_2$ ... $102_n$ writes to the completion queue doorbell 128 for the completion queue 120. The controller 124 may support multiple namespaces 130 that comprise portions of non-volatile memory spaces implemented in the storage devices 108. The storage controller $100_i$ may direct read and write requests to the namespaces 130 that map to non-volatile memory space in the storage devices 108. The storage devices 108 would further include hardware and software to interface with the NVMe controller 124.

The embodiment of FIG. 1B may implement NVMe over Fabrics, where the storage controller $100_i$ and subsystem 112 communicate over a fabric 114. In such embodiments, the storage controller $100_i$ and NVMe subsystem 112 include transport layers 132, 134 respectively to enable network communication, such as using Remote Direct Memory Access (RDMA), RDMA over Converged Ethernet (RoCE), Internet Wide-area RDMA Protocol (iWARP), InfiniBand, and Fibre Channel. In an alternative embodiment, the subsystem 112, such as an NVME subsystem 112 may be implemented in a Peripheral Component Interconnect Express (PCIe) card in the storage controller $100_i$, and the storage controller $100_i$ and NVMe subsystem 112 communicate over a PCIe interface.

The fabric 114 may comprise one or more networks including Local Area Networks (LAN), Storage Area Networks (SAN), Wide Area Network (WAN), peer-to-peer network, wireless network, the Internet, etc.

The storage controller $100_i$ maintains Input/Output (I/O) manager code 122, executed by the cores $102_1$, $102_2$ ... $102_n$, to stage and destage tracks from the storage devices 108 to the cache 106. The I/O manager code 122 may further implement Redundant Array of Independent Disk (RAID) algorithms, or other types of storage array management algorithms, to stripe tracks in stride groups onto the storage devices 108 and calculate parity for the tracks in a stride group to stripe with the tracks across the storage devices 108. The I/O manager 122 maintains stride group locks 200 for the stride groups configured in the storage devices 108 to manage reads, writes, stages and destages of tracks in stride groups being performed by the different cores $102_1$, $102_2$ ... $102_n$ to avoid contention and maintain cache and destage coherency.

The cores $102_1$, $102_2$ ... $102_n$ may comprise multiple cores on a same central processing unit (CPU)/integrated circuit substrate, or comprise separate processing units. Each core $102_1$, $102_2$ ... $102_n$ may execute the I/O manager 122 code to submit read and writes to tracks configured in strides in the storage devices 108 that are maintained in cache 106 to stage tracks from the storage devices 108 and destage stride groups of tracks from the cache 106 to stripe across the storage devices.

The I/O manager 122 may maintain a track index providing an index of tracks in the cache 106 to cache control blocks in a control block directory. The control block directory includes cache control blocks, where there is one cache control block for each track in the cache 106 providing metadata on the track in the cache, such as stride group information on the stride group in which the track is maintained. The track index associates tracks with the cache control blocks providing information on the tracks in the cache 106.

The storage controller $100_i$, may comprise a storage system, such as the International Business Machines Corporation (IBM®) DS8000® and DS8880 storage systems, or storage controllers and storage systems from other vendors. (IBM and DS8000 are trademarks of International Business Machines Corporation throughout the world).

The storage devices 108 in the storage array $110_i$ may comprise different types or classes of storage devices, such as magnetic hard disk drives, magnetic tape storage, solid state storage device (SSD) comprised of solid state electronics, EEPROM (Electrically Erasable Programmable Read-Only Memory), flash memory, flash disk, Random Access Memory (RAM) drive, storage-class memory (SCM), etc., Phase Change Memory (PCM), resistive random access memory (RRAM), spin transfer torque memory (STM-RAM), conductive bridging RAM (CBRAM), magnetic hard disk drive, optical disk, tape, etc. Volumes in a storage space may further be configured from an array of devices, such as Just a Bunch of Disks (JBOD), Direct Access Storage Device (DASD), Redundant Array of Independent Disks (RAID) array, virtualization device, etc. Further, the storage devices 108 in the storage array 110 may comprise heterogeneous storage devices from different vendors and different types of storage devices, such as a first type of storage devices, e.g., hard disk drives, that have a slower data transfer rate than a second type of storage devices, e.g., SSDs.

In NVMe implementations, the storage devices 108 would include NVMe components to interface with the NVMe subsystem 112, such as NVMe SSD devices.

The memory 104 may comprise a suitable system memory known in the art, including volatile and non-volatile memory devices, such as a Dynamic Random Access Memory (DRAM), a phase change memory (PCM), Magnetoresistive random-access memory (MRAM), Spin Transfer Torque (STT)-MRAM, SRAM storage devices, DRAM, a ferroelectric random-access memory (FeTRAM), nanowire-based non-volatile memory, and a Non-Volatile Direct In-Line Memory Modules (DIMMs) with byte-addressable write-in-place memory, etc.

Figure 2:
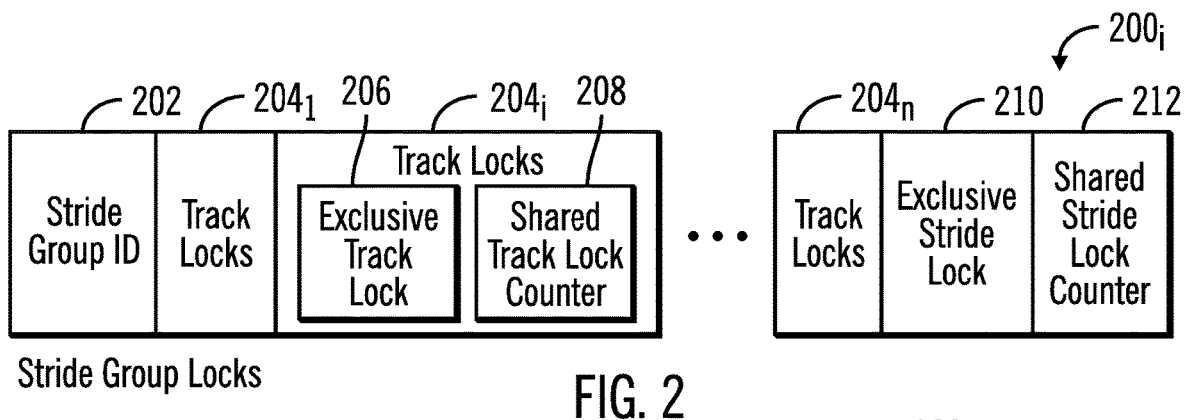
FIG. 2 illustrates an embodiment of track locks.

FIG. 2 illustrates an embodiments of an instance of stride group locks $200_i$ for one of the stride groups configured in the storage devices 108, including a stride group identifier (ID) 202 identifying a stride group; track locks $204_1$, $204_2$ ... $204_n$ for each of the tracks in the stride group 202, where the track locks 204, for each track in the stride group 202 includes an exclusive track lock 206 indicating whether an exclusive lock has been granted for the track and a shared track lock counter 208 indicating a number of shared track locks granted for the track; an exclusive stride lock 210 indicating that an exclusive lock to the stride group 202 has been granted; and a shared stride lock counter 212 indicating an number of shared stride locks that have been granted. The stride group lock $200_i$ information may further indicate the tracks in the stride group for which the locks $204_i$ are provided.

Figure 3:
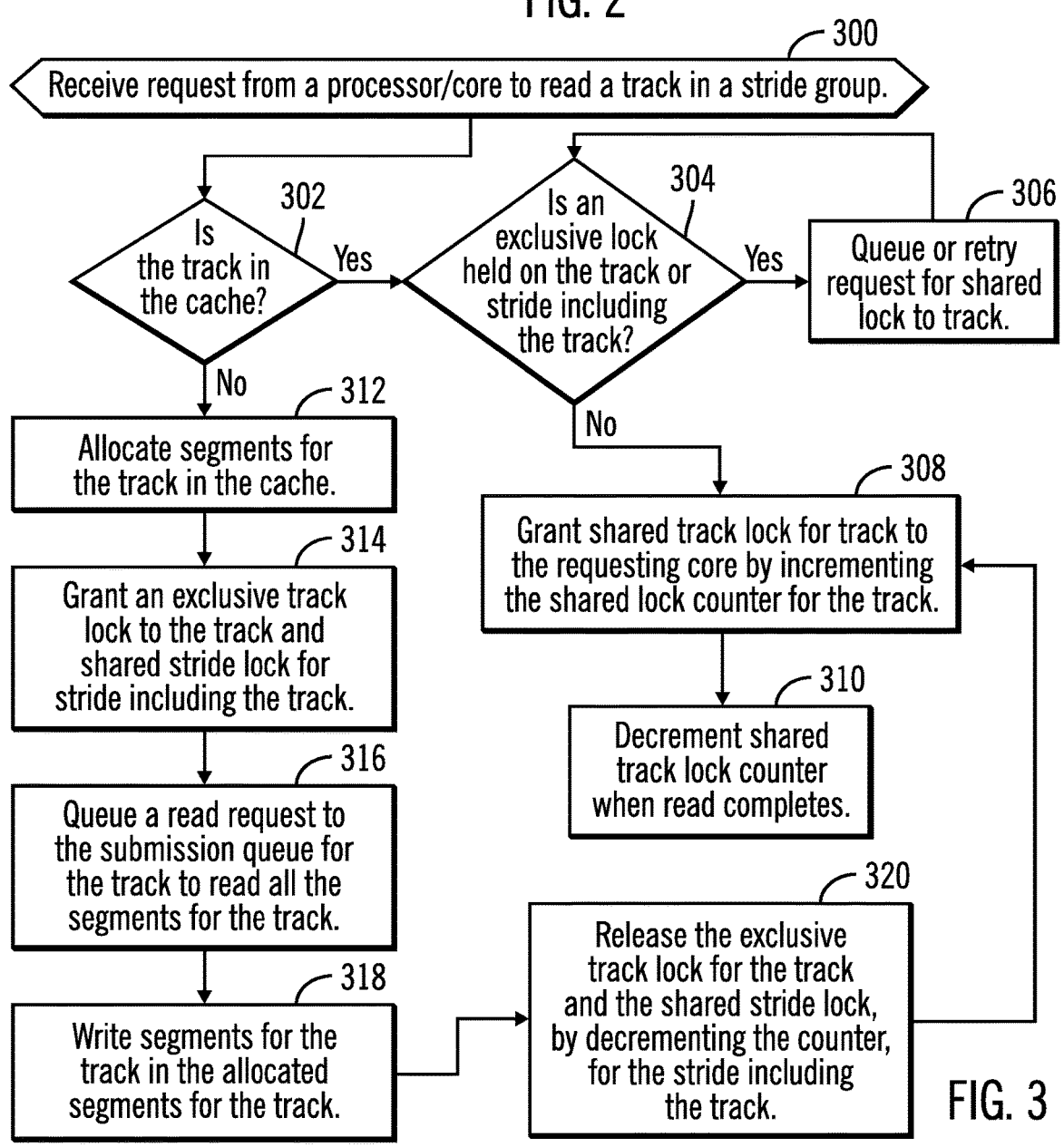
FIG. 3 illustrates an embodiment of operations to process a read request to a track in a stride group.

FIG. 3 illustrates an embodiment of operations performed by the I/O manager 122 executed by the cores $102_1$, $102_2$ ... $102_n$ to process a read request to a track in a stride group. Upon receiving (at block 300) a read from a processor/core $102_1$, $102_2$ ... $102_n$ to a track in a stride group, if (at block 302) the requested track is in the cache 106, then the I/O manager 122 determines (at block 304) whether an exclusive track lock 206 is held on the track or the stride 210 including the track. If so, then the track is being written or destaged, and the read request is queued or retried (at block 306) to obtain a shared lock to the track. If (at block 304) an exclusive track lock 206 or exclusive stride lock 210 is not held, then the shared track lock is granted (at block 308) to the requesting core $102_1$, $102_2$ ... $102_n$ by incrementing the shared track lock counter 208 for the track. The shared track lock counter 208 is decremented (at block 310) when the read completes.

If (at block 302) the requested track is not in the cache 106, then the I/O manager 122 allocates (at block 312) segments for the requested track in the cache 106 and grants (at block 314) an exclusive track lock 206 for the requested track and a shared stride lock, by incrementing the shared stride lock counter 212, for the stride including the track to stage. A read request is queued (at block 316) in the submission queue 118 to read the segments for the requested track. In NVMe implementations, an NVMe driver of the storage controller $100_i$ may write to a submission queue doorbell 126 over the fabric 114, or a bus interface, to signal the controller 124 that there is an I/O request to process in the submission queue 118 for the core $102_i$ initiating the read request. The controller 124 may write (at block 318) segments for the track in the allocated segments for the track in the cache 106. The controller 124 also writes complete to the completion queue 120 for the core $102_i$ initiating the request to signal the read has completed. The I/O manager 122 may then release (at block 320) the locks held for the track to stage by releasing the track lock 206 for the requested track and release the shared stride lock, by decrementing the shared stride lock counter 212, for the stride including the track to stage. After releasing the locks held for the stage process, control may proceed to block 308 to allow the initiating core $102_i$ to read the track from the cache 106.

With the embodiment of FIG. 3, an exclusive track lock 206 and shared stride lock are held for a track and stride group including the track to stage into cache for a read request before the track can be written or destaged. Described embodiments provide improvements to computer technology by allowing reads to occur to tracks while different cores may be concurrently writing to different tracks in a stride group or the track is in a stride group being destaged. Further, in certain embodiments, a destage to a stride group may be allowed to proceed while there are pending reads to tracks in the stride group. The described embodiments provide locks, data structures, and functions to coordinate operations to tracks in the cache and the staging of tracks into the cache.

Figure 4:
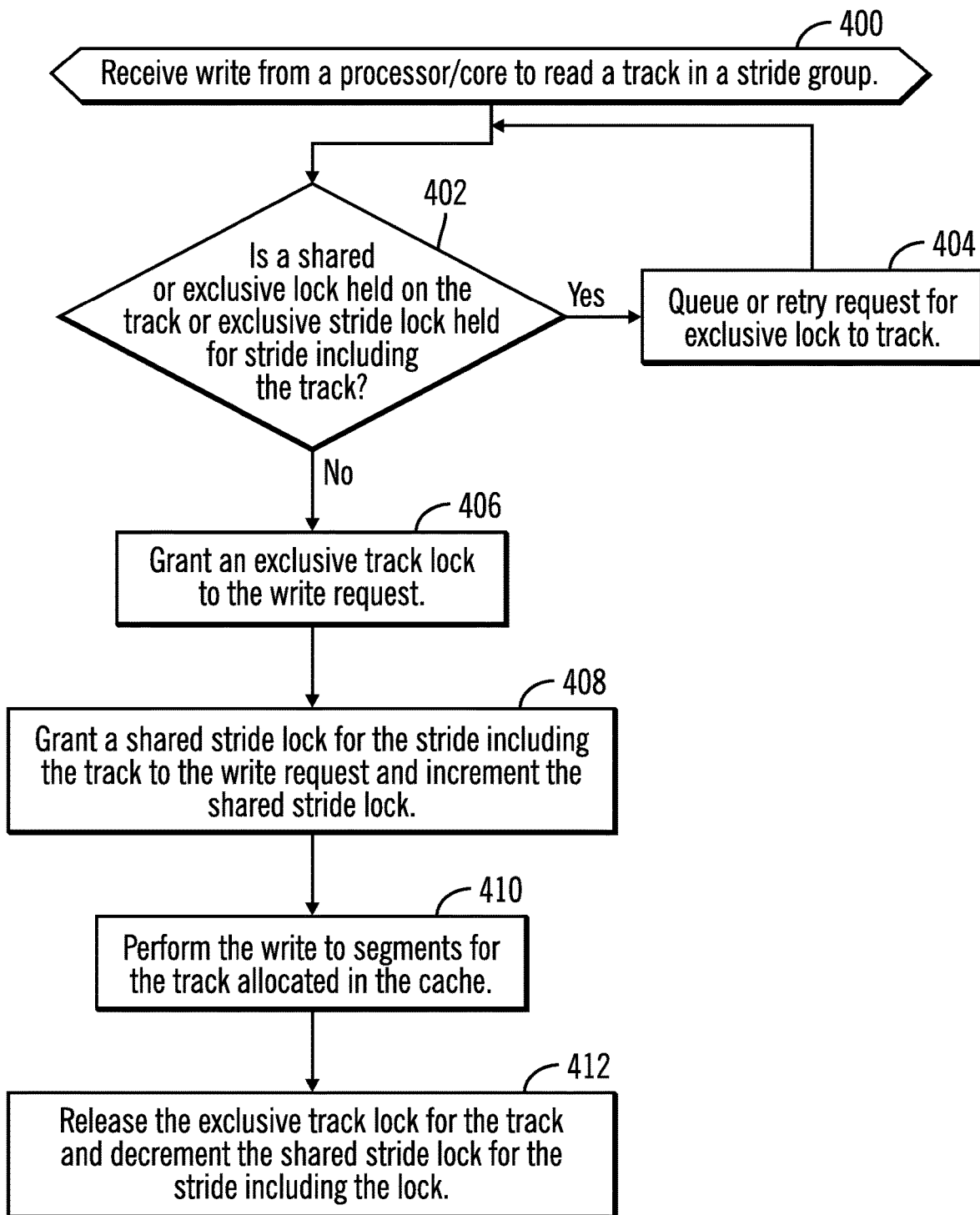
FIG. 4 illustrates an embodiment of operations to process a write request to a track in a stride group.

FIG. 4 illustrates an embodiment of operations performed by the I/O manager 122, executed by the cores $102_1$, $102_2$ ... $102_n$, to process a write request to a track in a stride group. Upon receiving (at block 400) a write from a processor/core $102_1$, $102_2$ ... $102_n$ to a track in a stride group, the I/O manager 122 determines (at block 402) whether an exclusive 206 or shared 208 track lock is held on the track or there is an exclusive stride lock 210 held on the stride group $200_i$ including the track to write. If so, then the track is being read, written or destaged, and the write request is queued or retried (at block 404) to obtain an exclusive lock 206 on the track. If (at block 402) an exclusive 206/shared 208 track lock or exclusive stride lock 210 is not held, then the exclusive track lock 206 is granted (at block 406) to the requesting core $102_1$, $102_2$ ... $102_n$ and a shared stride lock is granted (at block 408) by incrementing the shared stride lock counter 212 for the stride group including the track to write. The write is then performed (at block 410) to the track allocated in the cache 106. Upon completing the write, the exclusive track lock 206 is released (at block 412) and the shared stride lock is released by decrementing the shared stride lock counter 212.

With the embodiment of FIG. 4, an exclusive track lock and shared stride lock are held for a track and stride group including the track to write to prevent the track from being read or a stride group including the track being destaged while the track is being written in the cache 106. Described embodiments provide improvements to computer technology by allowing writes to simultaneously occur to tracks while different cores are concurrently writing to the tracks in a stride group and to coordinate the destaging of the stride group with the write operations by not initiating a write to a track subject to a pending write or in a stride group being destaged. Further, the described lock embodiments prevent a destage from proceeding while there are pending writes to tracks in the stride group, as indicated by shared stride locks being held, which is indicated by the shared stride lock counter 212 being greater than zero.

Figure 5:
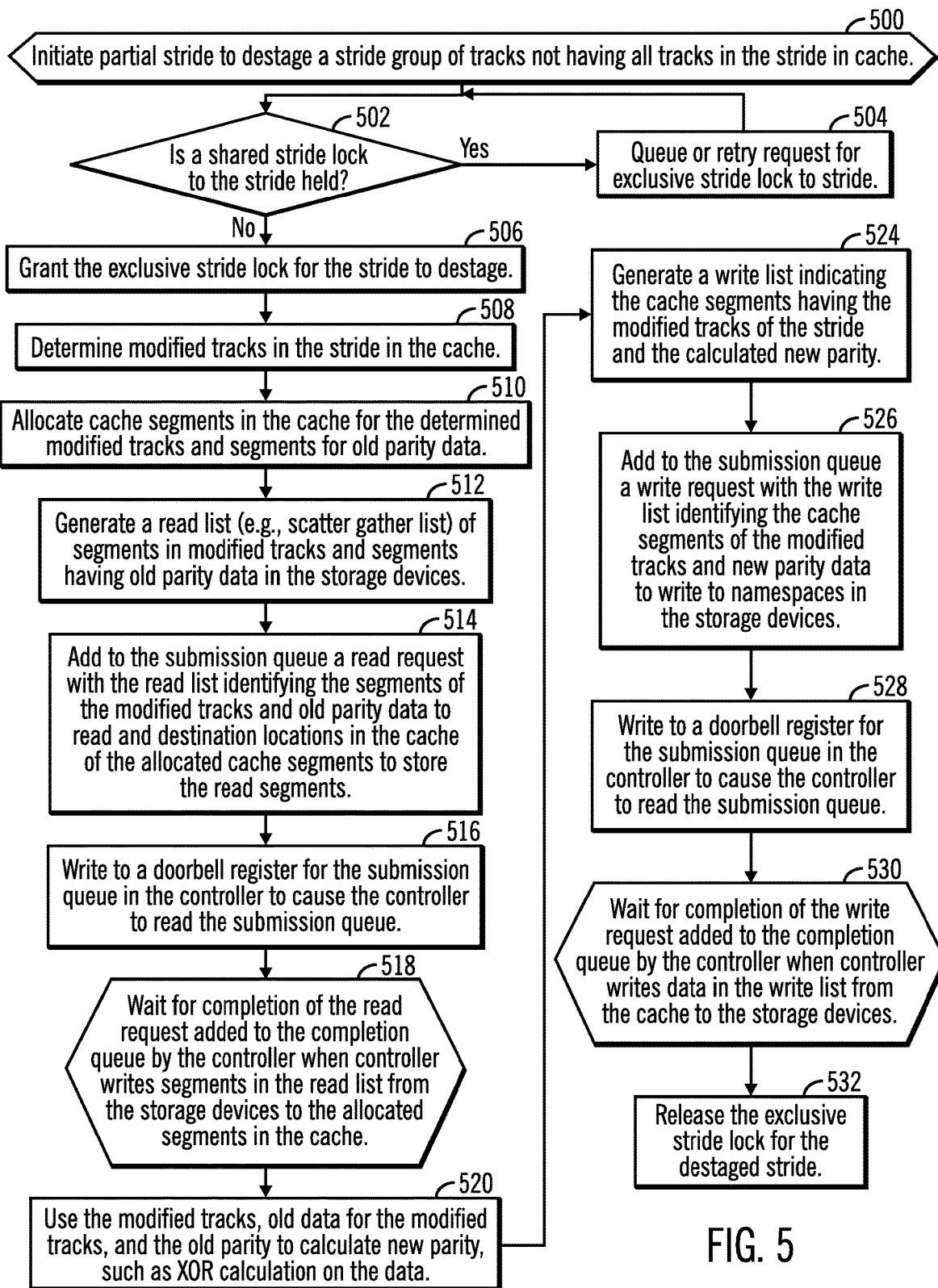
FIG. 5 illustrates an embodiment of operations to perform a partial stride destage of tracks in a stride group.

FIG. 5 illustrates an embodiment of operations performed by the I/O manager 122, executed by the cores $102_1$, $102_2 \ldots 102_n$, to destage a partial stride group having less than all the tracks in the stride group in the cache 106. The I/O manager 122 may initiate (at block 500) the destage operation by using a selection algorithm to select a stride group to destage, such as Wise Order Writing (WOW) or other suitable stride group selection techniques known in the art. If (at block 502) a shared stride lock is held for the stride group, as indicated by the shared stride lock counter 212 being greater than zero, then the destage request is queued or retried (at block 504) until the exclusive stride lock 210 can be granted. If (at block 502) a shared stride lock is not held for the stride group to destage, i.e., the shared stride lock counter 212 is zero, then the I/O manager 122 grants (at block 506) the exclusive stride lock 210 for the stride group to destage. A determination is made (at block 508) of modified tracks in the stride group in the cache 106. Cache segments are allocated (at block 510) in the cache 106 for the determined modified tracks and for the old parity data to be available to stage in the pre-modified version of the modified tracks and the old parity data from the storage devices 108. The I/O manager may generate (at block 512) a read list of segments in the modified tracks and segments having the old parity data in the storage devices 108 to stage into the allocated cache segments. In NVMe implementations, the read list may comprise a scatter gather list (SGL) or Physical Region Space (PRP) list indicating the segments to read into the cache 106 from the storage devices 108. The I/O manager 122 adds (at block 514) to the submission queue 118, for the core $102_i$ performing the destage operation, a read request (or multiple read requests) with the read list, identifying the segments of the modified tracks and old parity data to read, and destination locations in the cache 106 of the allocated cache segments to store the read segments. The I/O manager 122 writes (at block 516) to the doorbell register, submission queue doorbell 126, to signal the controller 124 to read the submission queue 118 to which the read request was added.

Upon the controller 124 adding (at block 518) completion to the completion queue 120 of the core $102_i$ performing the destage after the controller 124 writes the segments in the read list from the storage devices 108 to the allocated cache segments in the cache 106, the I/O manager 122 uses (at block 520) the modified tracks, old data for the modified tracks, and the old parity to calculate new parity, such as by an XOR calculation on the data performed during a read-modify-write to update parity. After updating the parity, the I/O manager 122 generates (at block 524) a write list, e.g., a scatter gather list or PRP list for NVMe implementations, indicating the cache 106 segments having the modified tracks of the stride group to destage and the calculated new parity. The I/O manager 122 adds (at block 526) to the submission queue 118 a write request (or multiple write requests) with the write list identifying the cache segments of the modified tracks and the new parity data to write to namespaces 130 in the storage devices 108. The I/O manager 122 writes (at block 528) to the doorbell register, submission queue doorbell 126, to signal the controller 124 to read the submission queue 118 to which the write request was added.

Upon the controller 124 adding (at block 530) completion to the completion queue 120 of the core $102_i$ performing the destage after the controller 124 writes the segments in the cache 106 indicated in the write list to the destination locations of the storage devices 108, the I/O manager 122 releases (at block 532) the exclusive stride lock 210 for the destaged stride.

With the embodiment of FIG. 5, an exclusive stride lock is held for a stride group to destage to prevent the track from being read or written while the track is being destaged, although pending reads may continue during the destage operation. Described embodiments provide improvements to computer technology for destaging a partial stride group by preventing writes and reads to be initiated during the destage operation and staging in the pre-modified version of segments for the modified tracks to use to update the parity when not all the tracks for the stride group to destage are in the cache. While there are pending writes to tracks in the stride group, as indicated by shared stride locks being held, which is indicated by the shared stride lock counter 212 being greater than zero.

Figure 6:
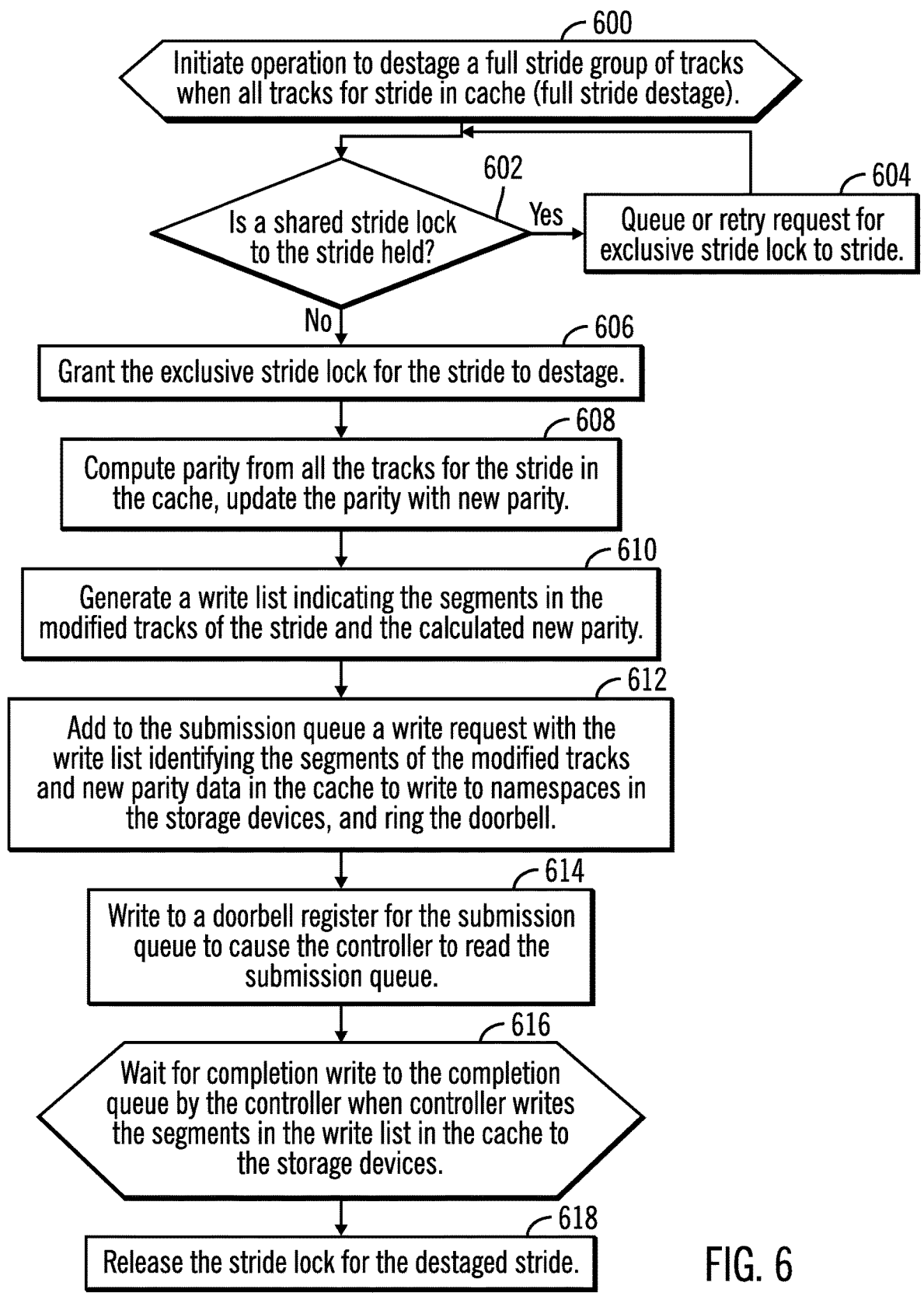
FIG. 6 illustrates an embodiment of operations to perform a full stride destage of tracks in a stride group.

FIG. 6 illustrates an embodiment of operations performed by the I/O manager 122, executed by the cores $102_1$, $102_2 \ldots 102_n$, to destage a full stride group when all the tracks for the stride group, including modified tracks, are in the cache 106. The I/O manager 122 may initiate (at block 600) the destage operation by using a selection algorithm to select a stride group to destage, such as Wise Order Writing (WOW) or other suitable stride group selection techniques known in the art. If (at block 602) a shared stride lock is held for the stride group, as indicated by the shared stride lock counter 212 being greater than zero, then the destage request is queued or retried (at block 604) until the exclusive stride lock 210 can be granted. If (at block 602) a shared stride lock is not held for the stride group to destage, i.e., the shared stride lock counter 212 is zero, then the I/O manager 122 grants (at block 606) the exclusive stride lock 210 for the stride group to destage. The I/O manager 122 then computes (at block 608) parity from all the tracks for the stride in the cache 106, and updates the parity with the new parity.

The I/O manager 122 generates (at block 610) a write list indicating the segments in the modified tracks of the stride and the calculated new parity. The I/O manager 122 adds (at block 612) to the submission queue 118 a write request with the write list identifying the cache segments of the modified tracks and the new parity data to write to namespaces in the storage devices 108. The I/O manager 122 writes (at block 614) to the submission queue doorbell 126 to signal the controller 124 to read the submission queue 118 to which the write request was added.

Upon the controller 124 adding (at block 616) completion to the completion queue 120 of the core $102_i$ performing the destage after the controller 124 writes the segments in the cache 106 indicated in the write list to the destination locations of the storage devices 108, the I/O manager 122 releases (at block 618) the exclusive stride lock 210 for the destaged stride.

With the embodiments of FIGS. 5 and 6, an exclusive stride lock is held for a stride group to destage to prevent the track from being read or written while the track is being destaged, although pending reads may continue during the destage operation. Described embodiments provide improvements to computer technology for destaging a partial or full stride group by preventing writes and reads to be initiated during the destage operation and staging in the pre-modified version of segments for the modified tracks to use to update the parity when not all the tracks for the stride group to destage are in the cache.

The operations of FIGS. 3-6 may be performed by the I/O manager 122 in each of the primary $100_1$ and secondary $100_2$ storage controller, i.e., a primary I/O manager $122_1$ at the primary storage controller $100_1$ and a secondary I/O manager $122_2$ at the secondary storage controller $100_2$, to manage read, writes, partial stride destage, and full stride destage operations to the respective primary $110_1$ and secondary $110_2$ storages.

Figure 7:
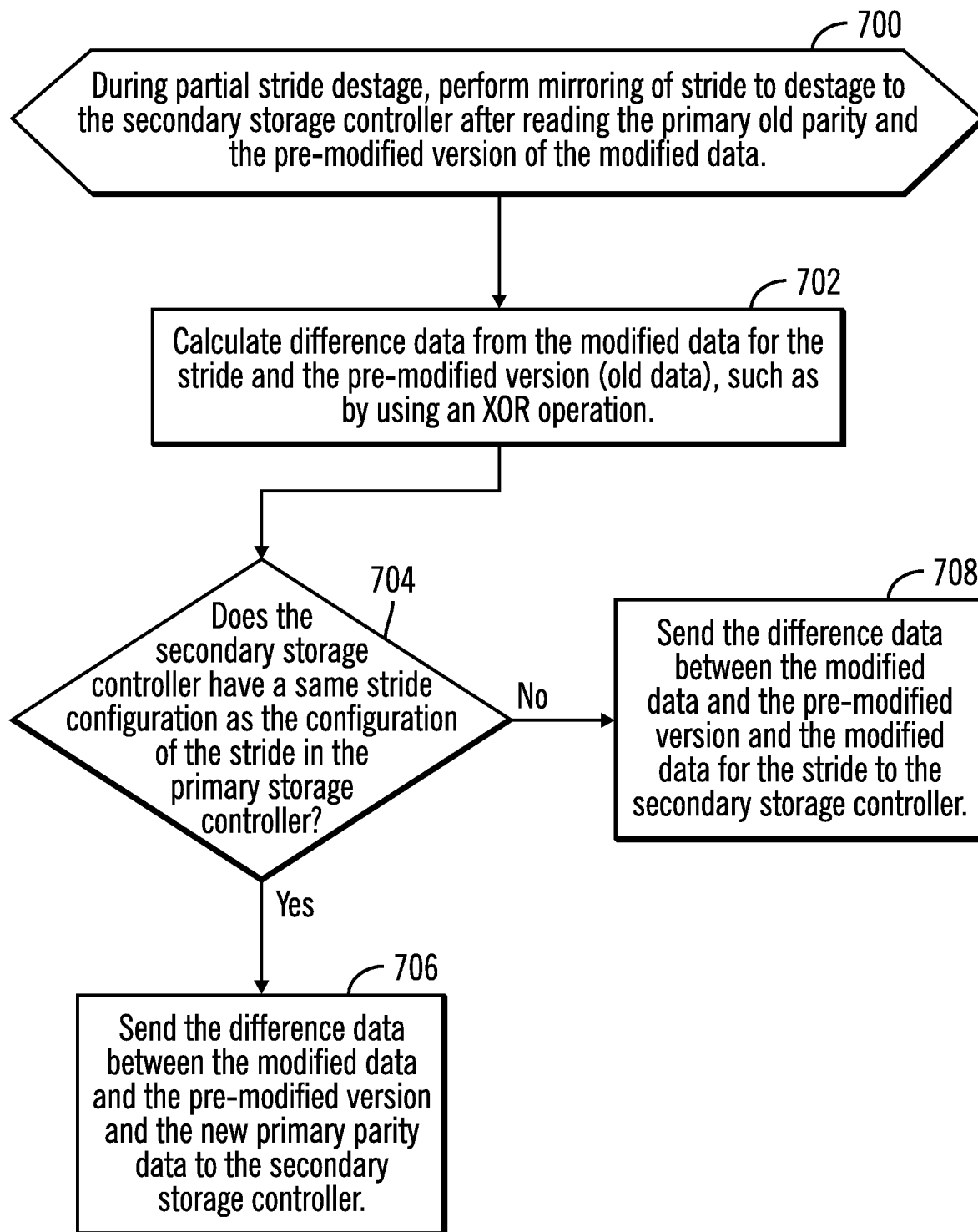
FIG. 7 illustrates an embodiment of operations to mirror modified data for a partial stride group in a primary cache of a primary storage controller to a secondary storage controller when destaging the partial stride in the primary cache.

FIG. 7 illustrates an embodiment of operations performed by the primary I/O manager $122_1$ executing in the primary storage controller $100_1$ during a partial stride destage as performed in FIG. 5 to mirror the modified data for the stride to destage to the secondary storage controller $100_2$. The mirroring operation of FIG. 7 may be initiated upon reading the pre-modified version of the modified segments and tracks and the old primary parity data at block 518 in FIG. 5. Upon initiating (at block 700) the mirroring, the primary I/O manager $122_1$ calculates (at block 702) difference data from the modified data for the stride group and the pre-modified version (old data), such as by combining the data in an exclusive OR (XOR) operation. The primary I/O manager $122_1$ determines (at block 704) whether the secondary storage controller $100_2$ has a same stride configuration as the configuration for strides in the primary storage controller $100_1$. This may be determined if both the primary $100_1$ and secondary $100_2$ storage controllers have a same RAID configuration, such as the same RAID level, e.g., RAID 5, etc. This compatibility of configurations may also be determined if the strides in the primary $100_1$ and secondary $100_2$ storage controllers start and end on a same track boundary, e.g., different track lengths, etc., or calculate parity data using a same parity calculation algorithm.

If (at block 704) the configurations are the same, then the primary I/O manager $122_1$ sends (at block 706) the difference data, e.g., XOR, between the modified data and the pre-modified version (old data), and the new parity data (calculated at block 520 in FIG. 5) to the secondary storage controller $100_2$. Because the stride configurations are the same, the parity calculated at the primary $100_1$ and secondary $100_2$ storage controllers for strides should be the same. If (at block 704) the configurations are the not the same, then the primary I/O manager $122_1$ sends (at block 708) the difference data, e.g., XOR, between the modified data and the pre-modified version (old data), and the modified data to the secondary storage controller $100_2$. At block 708, the primary storage controller $100_1$ sends sufficient data to allow the secondary storage controller $100_2$ to calculate the new secondary parity data, because the primary $100_1$ and secondary $100_2$ storage controllers do not generate the same parity data. Thus, the secondary storage controller $100_2$ cannot use the parity data calculated by the primary storage controller $100_1$.

With the embodiment of FIG. 7, the primary storage controller $100_1$ performing a partial stride destage sends the secondary storage controller $100_2$ sufficient data to allow the secondary storage controller to optimize parity calculation and read operations. If the parity calculation is not compatible between the primary $100_1$ and secondary $100_2$ storage controllers, then the primary storage controller $100_1$ sends the difference of the modified and pre-modified version of the data to allow the secondary storage controller $100_2$ to calculate parity data for the modified data without having to read the old version of the data from the secondary storage $110_2$. Further, sending the difference data optimizes computer operations by saving the secondary storage controller $100_2$ from having to XOR the modified data and pre-modified version of data to calculate parity, thus conserving computational resources at the secondary storage controller $100_2$.

Figure 8:
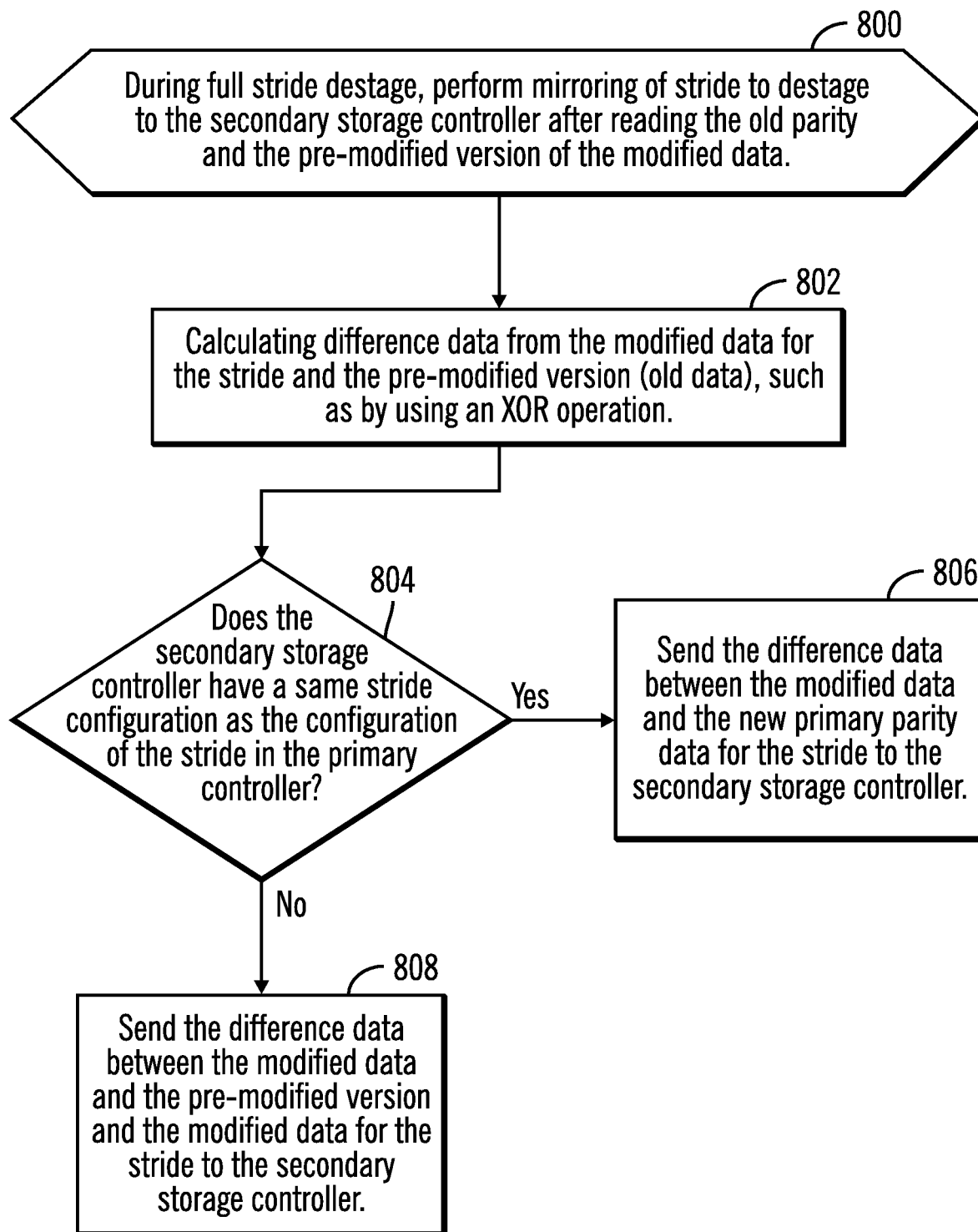
FIG. 8 illustrates an embodiment of operations to mirror modified data for a full stride group in a primary cache of a primary storage controller to a secondary storage controller when destaging the full stride in the primary cache.

FIG. 8 illustrates an embodiment of operations performed by a primary I/O manager $122_1$ executing in the primary storage controller $100_1$ during a full stride destage as performed in FIG. 6 to mirror modified data for the stride to i to the secondary storage controller $100_2$. The mirroring operation of FIG. 8 may be initiated after computing the new parity for the stride at block 608 in FIG. 6. Upon initiating (at block 800) the mirroring, the primary I/O manager $122_1$ calculates (at block 802) difference data from the modified data for the stride and the pre-modified version (old data), such as by combining the data in an exclusive OR (XOR) operation. The primary I/O manager $122_1$ determines (at block 804) whether the secondary storage controller $100_2$ has a same stride configuration as the configuration for strides in the primary storage controller $100_1$. This may be determined if both the primary $100_1$ and secondary $100_2$ storage controllers have a same RAID configuration, such as the same RAID level, e.g., RAID 5, etc. This compatibility of configurations may also be determined if the strides in the primary $100_1$ and secondary $100_2$ storage controllers start and end on a same track boundary, e.g., different track lengths, etc., or use a same parity calculation algorithm.

If (at block 804) the configurations are the same, then the primary I/O manager $122_1$ sends (at block 806) the difference data, e.g., XOR, between the modified data and the pre-modified version (old data) and the new parity data (calculated at block 608 in FIG. 6) to the secondary storage controller $100_2$. Because the stride configurations are the same, the parity calculated at the primary $100_1$ and secondary $100_2$ storage controllers for strides should be the same. If (at block 804) the configurations are not the same, then the primary I/O manager $122_1$ sends (at block 808) the difference, e.g., XOR, between the modified data and the pre-modified version (old data) and the modified data to the secondary storage controller $100_2$. At block 808, the primary storage controller $100_1$ sends sufficient data to allow the secondary storage controller $100_2$ to calculate the secondary parity data, because the primary $100_1$ and secondary $100_2$ storage controllers do not generate the same parity data. Thus, the secondary storage controller $100_2$ cannot use the parity data calculated by the primary storage controller $100_1$.

With the embodiment of FIG. 8, the primary storage controller $100_1$ performing a full stride destage sends the secondary storage controller $100_2$ sufficient data to allow the secondary storage controller to maximize parity and read operations. If the parity is not compatible between the primary $100_1$ and secondary $100_2$ storage controllers, then the primary storage controller $100_1$ sends the difference of the modified and pre-modified version of the data to allow the secondary storage controller $100_2$ to calculate parity data for the modified data without having to read the old version of the data from the secondary storage $110_2$. Further, sending the difference data saves the secondary storage controller $100_2$ from having to XOR the modified data and pre-modified version of data to calculate parity, thus conserving computational resources at the secondary storage controller $100_2$.

Figure 9:
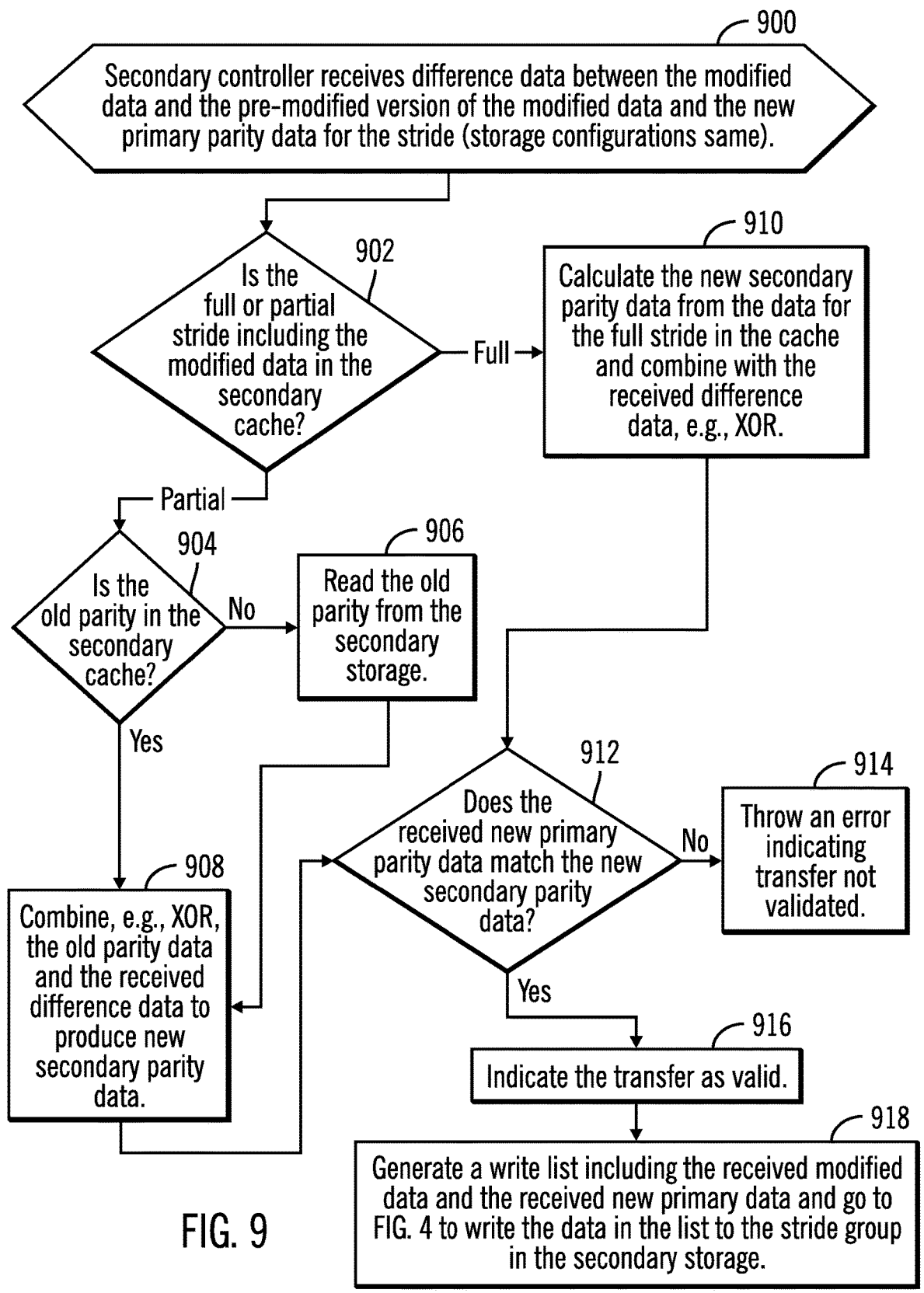
FIG. 9 illustrates an embodiment of operations for a secondary storage controller to process information on modified data for a stride group to mirror at a secondary storage when the primary and secondary storage configurations are the same.

FIG. 9 illustrates an embodiment of operations performed by the secondary I/O manager $122_2$ executed in the secondary storage controller $100_2$ upon receiving the difference data, calculated (XOR) from the modified data and the pre-modified version of the modified data, and the new primary parity data for the stride to the secondary controller when the primary and secondary storage controller stride configurations are the same. Upon receiving (at block 902) the difference data and the new primary parity data, if (at block 902) the partial stride is in the secondary cache $106_2$ and if (at block 904) the old parity data for the stride is not in the secondary cache $106_2$, then the secondary I/O manager $122_2$ reads (at block 906) the old parity data for the stride group from the secondary storage $110_2$, such as performing the operations of FIG. 3. If (at block 904) the old parity data is in the secondary cache $106_2$ or after reading the old parity data (at block 906), the secondary I/O manager $122_2$ combines (at block 908), e.g., XORs, the old parity data and the received difference data to produce new secondary parity data.

If (at block 902) the full stride is in the secondary cache $106_2$, then the secondary I/O manager $122_2$ calculates (at block 910) the new secondary parity data from the data for the full stride in the cache and combines (XOR) with the received difference data to factor in the modified data. After calculating the new secondary parity data at block 908 or 910, the secondary I/O manager $122_2$ determines (at block 912) whether the received new primary parity data matches the calculated new secondary parity data. If (at block 912) there is no match, then an error is thrown (at block 914) indicating that the transfer is not valid because the primary $100_1$ and secondary $100_2$ storage controllers use the same parity calculation method. If (at block 912) there is a match, then the transfer is indicated (at block 916) as valid and the secondary I/O manager $122_2$ generates (at block 918) a write list including the received modified data and the received new primary data to write according to operations of FIG. 4.

In an alternative embodiment, the secondary I/O manager $122_2$ may not calculate the new secondary parity data and validation operations at blocks 902-916, and instead just write the new parity data and the modified data to the stride in the secondary storage $110_2$.

With the embodiment of FIG. 9, the secondary storage controller $100_2$ calculates the new parity from either old parity data and the received difference data if only a partial stride is in the secondary cache $106_2$ or calculate the new parity from the full stride data in the cache and the difference data to use to validate the transferred data from the primary storage controller $100_1$. In this way, the secondary storage controller $100_2$ does not need to read the pre-modified version of the data to calculate parity because the difference data from the primary storage controller $100_1$ is used instead.

Figure 10:
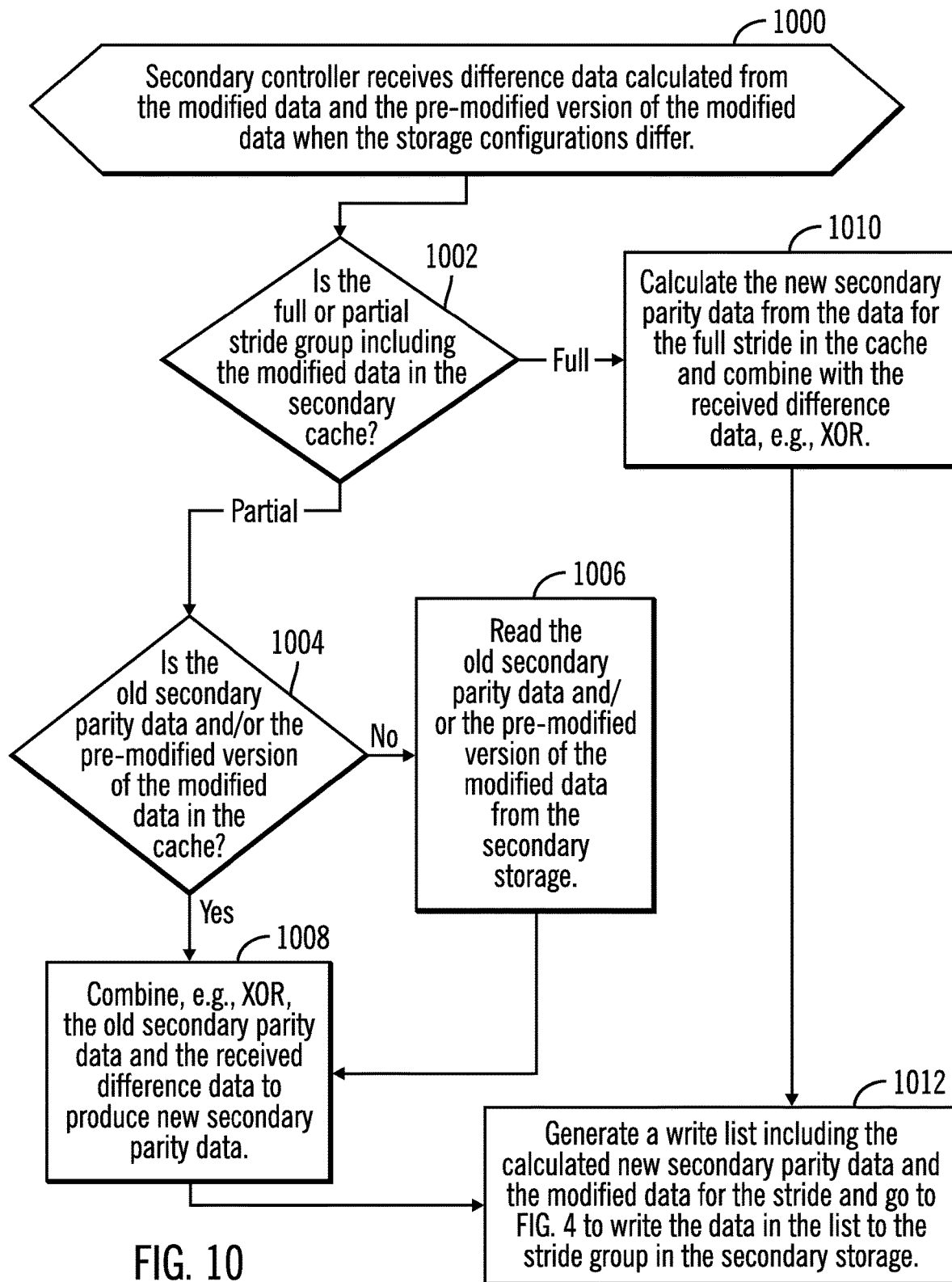
FIG. 10 illustrates an embodiment of operations for a secondary storage controller to process information on modified data for a stride group to mirror at a secondary storage when the primary and secondary storage configurations are different.

FIG. 10 illustrates an embodiment of operations performed by the secondary I/O manager $122_2$ executed in the secondary storage controller $100_2$ upon receiving the difference data (XOR) calculated from the modified data and the pre-modified version of the modified data and the modified data when the primary and secondary storage controller stride configurations are not the same. Upon receiving (at block 1000) the difference data and the new primary parity data, if (at block 1002) the partial stride is in the secondary cache $106_2$ and if (at block 1004) the old parity data for the stride and/or the pre-modified version of the modified data is not in the cache, then the secondary I/O manager $122_2$ reads (at block 1006) the old parity data/or the pre-modified version of the modified data from the secondary storage $110_2$, such as performing the operations of FIG. 2. If (at block 1004) the old parity data and the pre-modified version of the modified data are in the secondary cache $106_2$ or after reading the data (at block 1006), the secondary I/O manager $122_2$ combines (at block 1008), e.g., XOR, the old secondary parity data and the received difference data to produce new secondary parity data.

If (at block 1002) the full stride is in the secondary cache $106_2$, then the secondary I/O manager $122_2$ calculates (at block 1010) the new secondary parity data from the data for the full stride in the cache and combines (XOR) with the received difference. After calculating the new secondary parity data at block 1008 or 1010, the secondary I/O manager $122_2$ generates (at block 1012) a write list including the received modified data and the calculated new secondary parity data to write according to operations of FIG. 4.

With the embodiment of FIG. 10, the secondary storage controller $100_2$ calculates the new parity from either old parity data and the received difference data if only a partial stride is in the secondary cache $106_2$ or calculates the new parity from the full stride data in the cache and the difference data. In this way, the secondary storage controller $100_2$ does not need to read the pre-modified version of the data to calculate parity because the difference data from the primary storage controller $100_1$ is used instead.

The present invention may be implemented as a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 11:
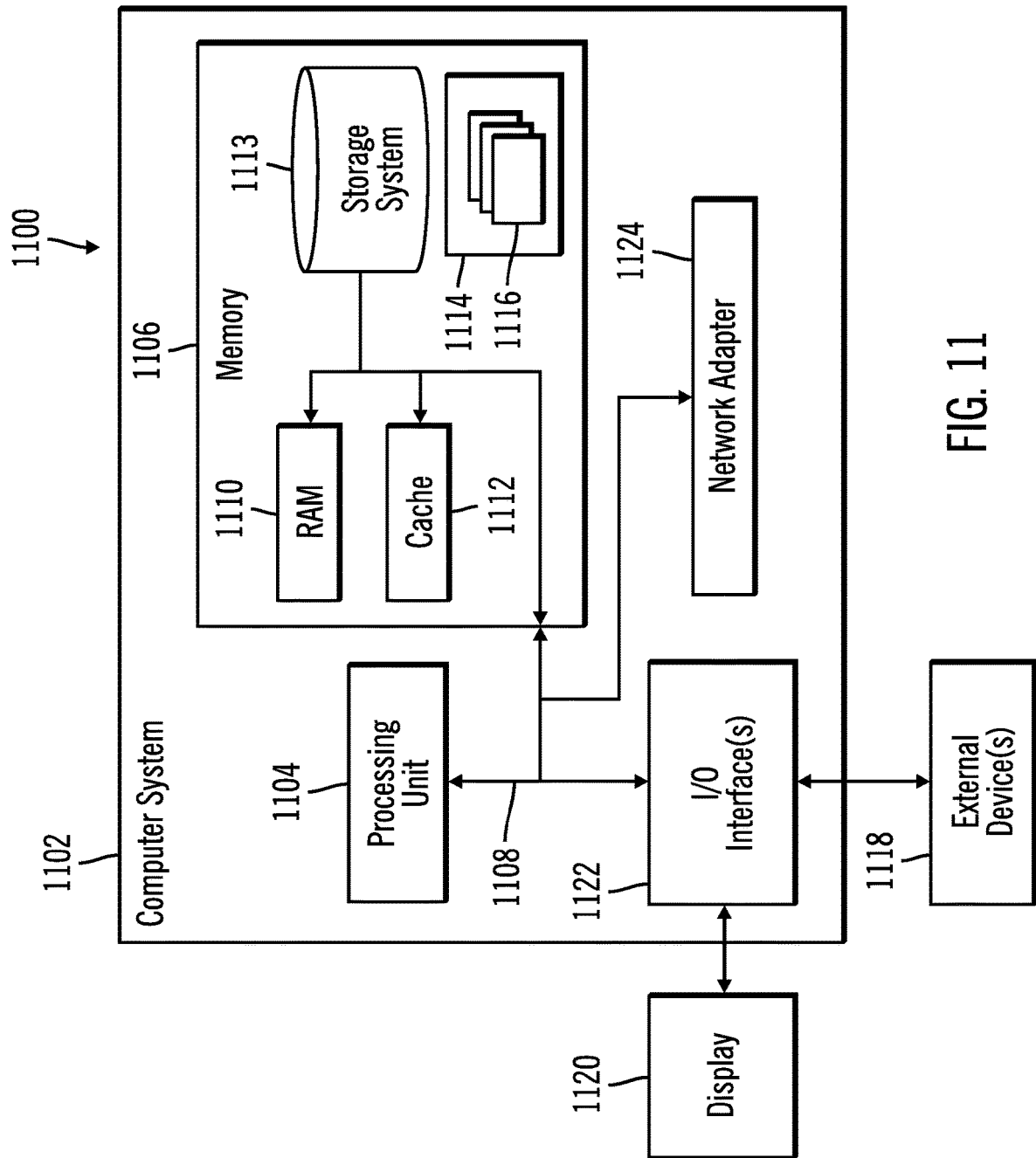
FIG. 11 illustrates a computing environment in which the components of FIG. 1 may be implemented.

The computational components of FIGS. 1 and 2, including the storage controller $100_1$, $100_2$, $100_i$ and subsystem 112 may be implemented in one or more computer systems, such as the computer system 1102 shown in FIG. 11. Computer system/server 1102 may be described in the general context of computer system executable instructions, such as program modules, being executed by a computer system. Generally, program modules may include routines, programs, objects, components, logic, data structures, and so on that perform particular tasks or implement particular abstract data types. Computer system/server 1102 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 11, the computer system/server 1102 is shown in the form of a general-purpose computing device. The components of computer system/server 1102 may include, but are not limited to, one or more processors or processing units 1104, a system memory 1106, and a bus 1108 that couples various system components including system memory 1106 to processor 1104. Bus 1108 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 1102 typically includes a variety of computer system readable media. Such media may be any available media that is accessible by computer system/server 1102, and it includes both volatile and non-volatile media, removable and non-removable media.

System memory 1106 can include computer system readable media in the form of volatile memory, such as random access memory (RAM) 1110 and/or cache memory 1112. Computer system/server 1102 may further include other removable/non-removable, volatile/non-volatile computer system storage media. By way of example only, storage system 1113 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided.

In such instances, each can be connected to bus 1108 by one or more data media interfaces. As will be further depicted and described below, memory 1106 may include at least one program product having a set (e.g., at least one) of program modules that are configured to carry out the functions of embodiments of the invention.

Program/utility 1114, having a set (at least one) of program modules 1116, may be stored in memory 1106 by way of example, and not limitation, as well as an operating system, one or more application programs, other program modules, and program data. Each of the operating system, one or more application programs, other program modules, and program data or some combination thereof, may include an implementation of a networking environment. The components of the computer 1102 may be implemented as program modules 1116 which generally carry out the functions and/or methodologies of embodiments of the invention as described herein. The systems of FIGS. 1A and 1B may be implemented in one or more computer systems 1102, where if they are implemented in multiple computer systems 1102, then the computer systems may communicate over a network.

Computer system/server 1102 may also communicate with one or more external devices 1118 such as a keyboard, a pointing device, a display 1120, etc.; one or more devices that enable a user to interact with computer system/server 1102; and/or any devices (e.g., network card, modem, etc.) that enable computer system/server 1102 to communicate with one or more other computing devices. Such communication can occur via Input/Output (I/O) interfaces 1122. Still yet, computer system/server 1102 can communicate with one or more networks such as a local area network (LAN), a general wide area network (WAN), and/or a public network (e.g., the Internet) via network adapter 1124. As depicted, network adapter 1124 communicates with the other components of computer system/server 1102 via bus 1108. It should be understood that although not shown, other hardware and/or software components could be used in conjunction with computer system/server 1102. Examples, include, but are not limited to: microcode, device drivers, redundant processing units, external disk drive arrays, RAID systems, tape drives, and data archival storage systems, etc.

The terms "an embodiment", "embodiment", "embodiments", "the embodiment", "the embodiments", "one or more embodiments", "some embodiments", and "one embodiment" mean "one or more (but not all) embodiments of the present invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments of the present invention.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments of the present invention need not include the device itself.

The foregoing description of various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims herein after appended.

What is claimed is:

1. A computer program product for a secondary storage controller storing data in a secondary storage to receive data mirrored from a primary storage controller storing data in a primary storage, the computer program product comprising a computer readable storage medium having computer readable program code embodied therein that when executed at the secondary storage controller performs operations, the operations comprising:
 receiving, from the primary storage controller:
  difference data calculated from modified data;
  a pre-modified version of the modified data for a primary group of tracks at the primary storage; and
  one of the modified data and new primary parity data, wherein the new primary parity data is calculated at the primary storage controller from the modified data and the difference data; and
 using the difference data and additionally one of either the modified data and the new primary parity data to write new secondary parity data and the modified data to a secondary group of tracks at the secondary storage.

2. The computer program product of claim 1, wherein the difference data is calculated by performing an XOR of the modified data and the pre-modified version of the modified data.

3. The computer program product of claim 1, wherein the operations further comprise:
 in response to receiving the difference data and the new primary parity data, writing the new primary parity data to the secondary storage as the new secondary parity data and update the secondary group of tracks with the received difference data to update the pre-modified version of the modified data in the secondary group of tracks to have the modified data.

4. The computer program product of claim 3, wherein the primary storage and the secondary storage have a same configuration.

5. The computer program product of claim 1, wherein the operations further comprise:
   in response to receiving the difference data and the modified data, combining the received difference data and old secondary parity data for the secondary group of tracks to produce the new secondary parity data to write to the secondary storage and updating the secondary group of tracks with the received modified data to update the pre-modified version of the modified data in the secondary group of tracks to the modified data.

6. The computer program product of claim 5, wherein the primary storage and the secondary storage have a different configuration.

7. The computer program product of claim 1, wherein the operations further comprise:
   receiving the difference data and the new primary parity data from the primary storage controller;
   calculating the new secondary parity data from data for the secondary group of tracks from all data for the secondary group of tracks in a secondary cache at the secondary storage controller and the received difference data;
   comparing the new secondary parity data and the new primary parity data;
   validating transfers from the primary storage controller in response to determining that new secondary parity data and the new primary parity data match; and
   throwing an exception in response to determining that new secondary parity data and the new primary parity data do not match.

8. The computer program product of claim 1, wherein the operations further comprise:
   receiving the difference data and the new primary parity data from the primary storage controller;
   reading old secondary parity data for the secondary group of tracks for which the difference data and the new primary parity data are received from the secondary storage;
   calculating the new secondary parity data from the received difference data and the old secondary parity data;
   comparing the new secondary parity data and the new primary parity data;
   validating transfers from the primary storage controller in response to determining that new secondary parity data and the new primary parity data match; and
   throwing an exception in response to determining that new secondary parity data and the new primary parity data do not match.

9. The computer program product of claim 1, wherein the operations further comprise:
   obtaining an exclusive group lock for the secondary group of tracks in response to no shared or exclusive lock held for a track in the secondary group of tracks or no exclusive or shared group lock held for the secondary group of tracks, wherein writing the new secondary parity data and the modified data to the secondary group of tracks in response to obtaining the exclusive group lock for the primary group of tracks is held; and
   releasing the exclusive group lock in response to completing of writing of the new primary parity data and the modified data to the secondary storage.

10. A system comprising a secondary storage controller storing data in a secondary storage and in communication with a primary storage controller storing data in a primary storage mirrored to the secondary storage controller, comprising:
    a processor; and
    a computer readable storage medium having computer readable program code embodied therein that when executed by the processor performs operations, the operations comprising:
       receiving, from the primary storage controller:
          difference data calculated from modified data;
          a pre-modified version of the modified data for a primary group of tracks at the primary storage; and
          one of the modified data and new primary parity data, wherein the new primary parity data is calculated at the primary storage controller from the modified data and the difference data; and
       using the difference data and additionally one of either the modified data and the new primary parity data to write new secondary parity data and the modified data to a secondary group of tracks at the secondary storage.

11. The system of claim 10, wherein the difference data is calculated by performing an XOR of the modified data and the pre-modified version of the modified data.

12. The system of claim 10, wherein the operations further comprise:
    in response to receiving the difference data and the new primary parity data, writing the new primary parity data to the secondary storage as the new secondary parity data and update the secondary group of tracks with the received difference data to update the pre-modified version of the modified data in the secondary group of tracks to have the modified data.

13. The system of claim 10, wherein the operations further comprise:
    in response to receiving the difference data and the modified data, combining the received difference data and old secondary parity data for the secondary group of tracks to produce the new secondary parity data to write to the secondary storage and updating the secondary group of tracks with the received modified data to update the pre-modified version of the modified data in the secondary group of tracks to the modified data.

14. The system of claim 10, wherein the operations further comprise:
    receiving the difference data and the new primary parity data from the primary storage controller;
    calculating the new secondary parity data from data for the secondary group of tracks from all data for the secondary group of tracks in a secondary cache at the secondary storage controller and the received difference data;
    comparing the new secondary parity data and the new primary parity data;
    validating transfers from the primary storage controller in response to determining that new secondary parity data and the new primary parity data match; and
    throwing an exception in response to determining that new secondary parity data and the new primary parity data do not match.

15. The system of claim 10, wherein the operations further comprise:
- receiving the difference data and the new primary parity data from the primary storage controller;
- reading old secondary parity data for the secondary group of tracks for which the difference data and the new primary parity data are received from the secondary storage;
- calculating the new secondary parity data from the received difference data and the old secondary parity data;
- comparing the new secondary parity data and the new primary parity data;
- validating transfers from the primary storage controller in response to determining that new secondary parity data and the new primary parity data match; and
- throwing an exception in response to determining that new secondary parity data and the new primary parity data do not match.

16. The system of claim 10, wherein the operations further comprise:
- obtaining an exclusive group lock for the secondary group of tracks in response to no shared or exclusive lock held for a track in the secondary group of tracks or no exclusive or shared group lock held for the secondary group of tracks, wherein writing the new secondary parity data and the modified data to the secondary group of tracks in response to obtaining the exclusive group lock for the primary group of tracks is held; and
- releasing the exclusive group lock in response to completing of writing of the new primary parity data and the modified data to the secondary storage.

17. A method for a secondary storage controller storing data in a secondary storage to process mirrored data from a primary storage controller storing data in a primary storage, comprising:
- receiving, from the primary storage controller:
  - difference data calculated from modified data;
  - a pre-modified version of the modified data for a primary group of tracks at the primary storage; and
  - one of the modified data and new primary parity data, wherein the new primary parity data is calculated at the primary storage controller from the modified data and the difference data; and
- using the difference data and additionally one of either the modified data and the new primary parity data to write new secondary parity data and the modified data to a secondary group of tracks at the secondary storage.

18. The method of claim 17, wherein the difference data is calculated by performing an XOR of the modified data and the pre-modified version of the modified data.

19. The method of claim 17, further comprising:
- in response to receiving the difference data and the new primary parity data, writing the new primary parity data to the secondary storage as the new secondary parity data and update the secondary group of tracks with the received difference data to update the pre-modified version of the modified data in the secondary group of tracks to have the modified data.

20. The method of claim 17, further comprising:
- in response to receiving the difference data and the modified data, combining the received difference data and old secondary parity data for the secondary group of tracks to produce the new secondary parity data to write to the secondary storage and updating the secondary group of tracks with the received modified data to update the pre-modified version of the modified data in the secondary group of tracks to the modified data.

21. The method of claim 17, further comprising:
- receiving the difference data and the new primary parity data from the primary storage controller;
- calculating the new secondary parity data from data for the secondary group of tracks from all data for the secondary group of tracks in a secondary cache at the secondary storage controller and the received difference data;
- comparing the new secondary parity data and the new primary parity data;
- validating transfers from the primary storage controller in response to determining that new secondary parity data and the new primary parity data match; and
- throwing an exception in response to determining that new secondary parity data and the new primary parity data do not match.

22. The method of claim 17, further comprising:
- receiving the difference data and the new primary parity data from the primary storage controller;
- reading old secondary parity data for the secondary group of tracks for which the difference data and the new primary parity data are received from the secondary storage;
- calculating the new secondary parity data from the received difference data and the old secondary parity data;
- comparing the new secondary parity data and the new primary parity data;
- validating transfers from the primary storage controller in response to determining that new secondary parity data and the new primary parity data match; and
- throwing an exception in response to determining that new secondary parity data and the new primary parity data do not match.

23. The method of claim 17, further comprising:
- obtaining an exclusive group lock for the secondary group of tracks in response to no shared or exclusive lock held for a track in the secondary group of tracks or no exclusive or shared group lock held for the secondary group of tracks, wherein writing the new secondary parity data and the modified data to the secondary group of tracks in response to obtaining the exclusive group lock for the primary group of tracks is held; and
- releasing the exclusive group lock in response to completing of writing of the new primary parity data and the modified data to the secondary storage.

* * * * *